United States Patent
Kim et al.

(10) Patent No.: US 11,592,919 B2
(45) Date of Patent: Feb. 28, 2023

(54) ELECTRONIC PANEL AND DISPLAY DEVICE INCLUDING THE SAME

(71) Applicant: Samsung Display Co., Ltd., Yongin-si (KR)

(72) Inventors: Jong-Hwa Kim, Yongin-si (KR); Wonkyu Kwak, Seongnam-si (KR); Il-Joo Kim, Hwaseong-si (KR); Youngbae Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 31 days.

(21) Appl. No.: 16/951,930

(22) Filed: Nov. 18, 2020

(65) Prior Publication Data

US 2021/0247866 A1    Aug. 12, 2021

(30) Foreign Application Priority Data

Feb. 7, 2020   (KR) .................. 10-2020-0014920

(51) Int. Cl.
 G06F 3/041    (2006.01)
 G09G 3/3208   (2016.01)

(52) U.S. Cl.
 CPC ......... *G06F 3/0412* (2013.01); *G09G 3/3208* (2013.01); *G09G 2310/08* (2013.01)

(58) Field of Classification Search
 CPC ......... G06F 2203/04111; G06F 3/0412; G06F 3/04164; G06F 3/0443; G06F 3/0446
 See application file for complete search history.

(56) References Cited

U.S. PATENT DOCUMENTS

| | | | |
|---|---|---|---|
| 9,335,881 B2 | 5/2016 | Jeong | |
| 2014/0028599 A1* | 1/2014 | Jeong | G06F 3/0446 345/173 |
| 2020/0081583 A1* | 3/2020 | Na | G06F 3/0412 |

FOREIGN PATENT DOCUMENTS

| | | |
|---|---|---|
| CN | 101699379 | 5/2011 |
| KR | 10-1506512 | 3/2015 |
| KR | 10-1941255 | 1/2019 |

* cited by examiner

*Primary Examiner* — Robin J Mishler
(74) *Attorney, Agent, or Firm* — H.C. Park & Associates, PLC

(57) ABSTRACT

An electronic panel including a base layer having a sensing area and a peripheral area adjacent to the sensing area, sensing electrodes overlapping the sensing area and disposed on the base layer, first lines overlapping the peripheral area and connected to one end and the other end of each of the sensing electrodes, an insulation layer including a first insulation portion configured to cover the sensing electrodes and disposed on the base layer and a second insulation portion configured to cover at least a portion of each of the first lines and disposed on the base layer, and second lines disposed on the second insulation portion and respectively electrically connected to the first lines through contact holes defined in the second insulation portion. The at least a portion of each of the first lines has a meandering shape.

15 Claims, 14 Drawing Sheets

ELECTRONIC PANEL AND DISPLAY DEVICE INCLUDING THE SAME

CROSS-REFERENCE TO RELATED APPLICATIONS

This application claims priority from and the benefit of Korean Patent Application No. 10-2020-0014920, filed on Feb. 7, 2020, which is hereby incorporated by reference for all purposes as if fully set forth herein.

BACKGROUND

Field

Embodiments of the present invention relate to a display device, and more particularly, to an electronic panel through which an external input is enabled and a display device including the same.

Discussion of the Background

Various display devices used in multimedia equipment, such as televisions, mobile phones, table computers, navigation devices, and game consoles, are being developed. The display device may include an electronic panel displaying an image and sensing an external input, a polarizing layer disposed on the display panel, and a window.

The electronic panel may include a display panel displaying an image and an input sensing layer sensing an external input. The input sensing layer includes a plurality of sensing electrodes and a plurality of sensing lines connected to the sensing electrodes. The sensing lines of the input sensing layer are electrically connected to an external circuit board.

The above information disclosed in this Background section is only for understanding of the background of the inventive concepts, and, therefore, it may contain information that does not constitute prior art.

SUMMARY

Embodiments of the inventive concept provide an electronic panel that is capable of preventing sensing lines from being damaged by external static electricity and a display device including the same.

Additional features of the inventive concepts will be set forth in the description which follows, and in part will be apparent from the description, or may be learned by practice of the inventive concept.

An embodiment of the inventive concept provides an electronic panel including: a base layer including a sensing area and a peripheral area adjacent to the sensing area; sensing electrodes overlapping the sensing area and disposed on the base layer; first lines overlapping the peripheral area and connected to each of the sensing electrodes; an insulation layer including a first insulation portion configured to cover the sensing electrodes and disposed on the base layer and a second insulation portion configured to cover at least a portion of each of the first lines and disposed on the base layer; and second lines disposed on the second insulation portion and respectively electrically connected to the first lines through contact holes defined in the second insulation portion, wherein the at least a portion of each of the first lines has a meandering shape.

The at least a portion of each of the first lines may include: a first portion extending in a first direction; a second portion extending in the first direction to face the first portion in a second direction different from the first direction; and a third portion extending in the second direction to connect the first portion to the second portion.

The at least a portion of each of the first lines may have a curved shape.

The first lines may include: first sub-lines, each of which is connected to one end of each of the sensing electrodes; second sub-lines connected to other ends of the sensing electrodes, respectively; and connection lines respectively connected to the second lines through the contact holes and configured to connect the first sub-lines to the second sub-lines, wherein each of the connection lines may have the meandering shape.

The connection lines may be entirely covered by the second insulation portion.

One second sub-line of the second sub-lines may cross two or more second lines of the second lines on a plane.

Each of the first sub-lines may have the meandering shape.

The first sub-lines may not overlap the insulation layer.

The first sub-lines, the second sub-lines, and the connection lines may be disposed on the base layer through the same process.

The second lines may extend in a first direction and be spaced a predetermined distance from each other in a second direction different from the first direction, and each of the second lines may have a planar area per unit length, which is greater than that of each of the first lines.

Each of the second lines may include a first line portion bonded to an external circuit board and a second line portion that overlaps the at least a portion of each of the first lines, and the at least the portion of each of the first lines may be disposed between the contact holes and the first line portion in the first direction.

The contact holes may be disposed in the same line in the second direction.

The second lines may have the same length in the first direction.

At least two of the second lines may have different lengths in the first direction, and the contact holes overlapping the two second lines among the contact holes may be defined in different lines in the second direction.

The first insulation portion and the second insulation portion may be spaced apart from each other on a plane.

Each of the first lines may include a metal, and each of the second lines may include an ITO electrode.

Another embodiment of the inventive concept provides a display device including: a display panel; and an input sensing layer disposed on the display panel and including a sensing area and a peripheral area adjacent to the sensing area, wherein the input sensing layer includes: a first insulation layer disposed on the display panel; first lines overlapping the peripheral area and disposed on the first insulation layer, the first lines including connection lines, first sub-lines, each of which is adjacent to one end of each of the connection lines, and second sub-lines adjacent to the other ends of each of the connection lines; a second insulation layer including a first insulation portion overlapping the sensing area and a second insulation portion overlapping the peripheral area and configured to cover a portion of each of the connection lines; sensing electrodes overlapping the sensing area and disposed on the first insulation portion, each sensing electrode including one end connected to each of the first sub-lines and the other end connected to each of the second sub-lines; and second lines disposed on the second insulation portion, the second lines being electrically connected to the connection lines through contact holes defined in the second insulation portion, respectively, wherein at least a portion of each of the connection lines has a meandering shape.

The display device may further include a circuit board configured to provide a sensing signal to the input sensing layer, wherein each of the second lines may include a first line portion bonded to the circuit board and a second line portion that overlaps the at least a portion of each of the first lines, and the at least a portion of each of the connection lines may be disposed between the contact holes and the first line portion.

The first sub-lines, the second sub-lines, and the connection lines may be disposed on the first insulation layer through the same process, and each of the second lines may have a planar area per unit length, which is greater than that of each of the first lines One second line of the second lines may cross at least one or more first lines of the first lines on a plane.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION

Figure 1:
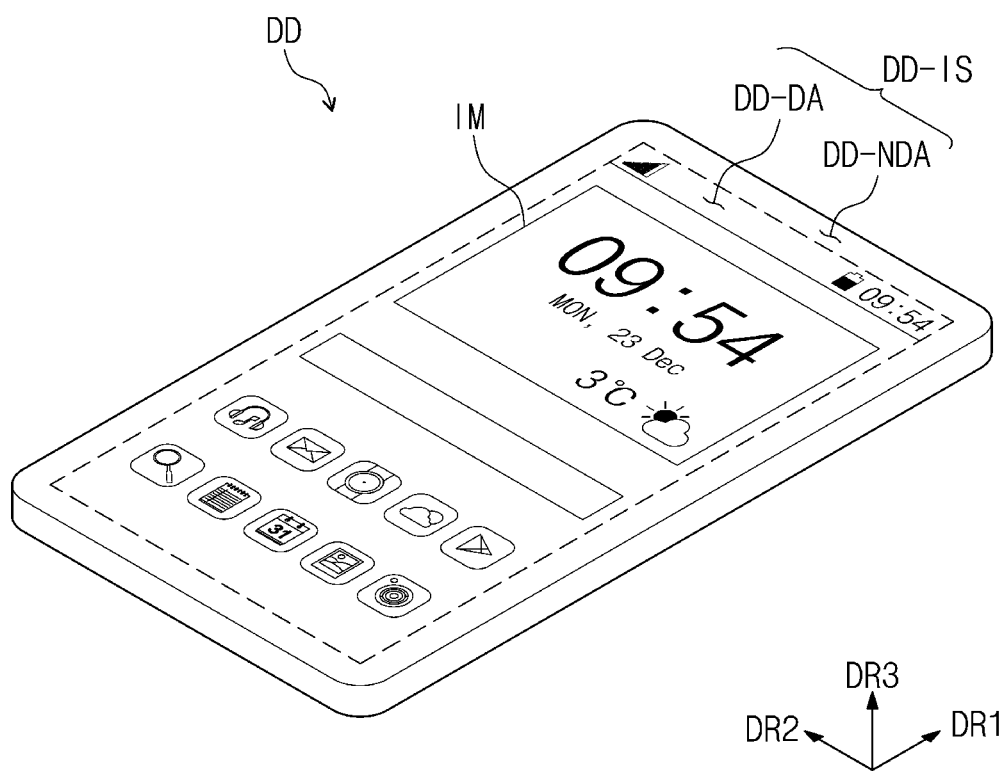
FIG. 1 is a perspective view of a display device according to an embodiment of the inventive concept.

In the following description, for the purposes of explanation, numerous specific details are set forth in order to provide a thorough understanding of various embodiments of the invention. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concept may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concept.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, exemplary embodiments of the inventive concept will be described with reference to the accompanying drawings.

Figure 2:
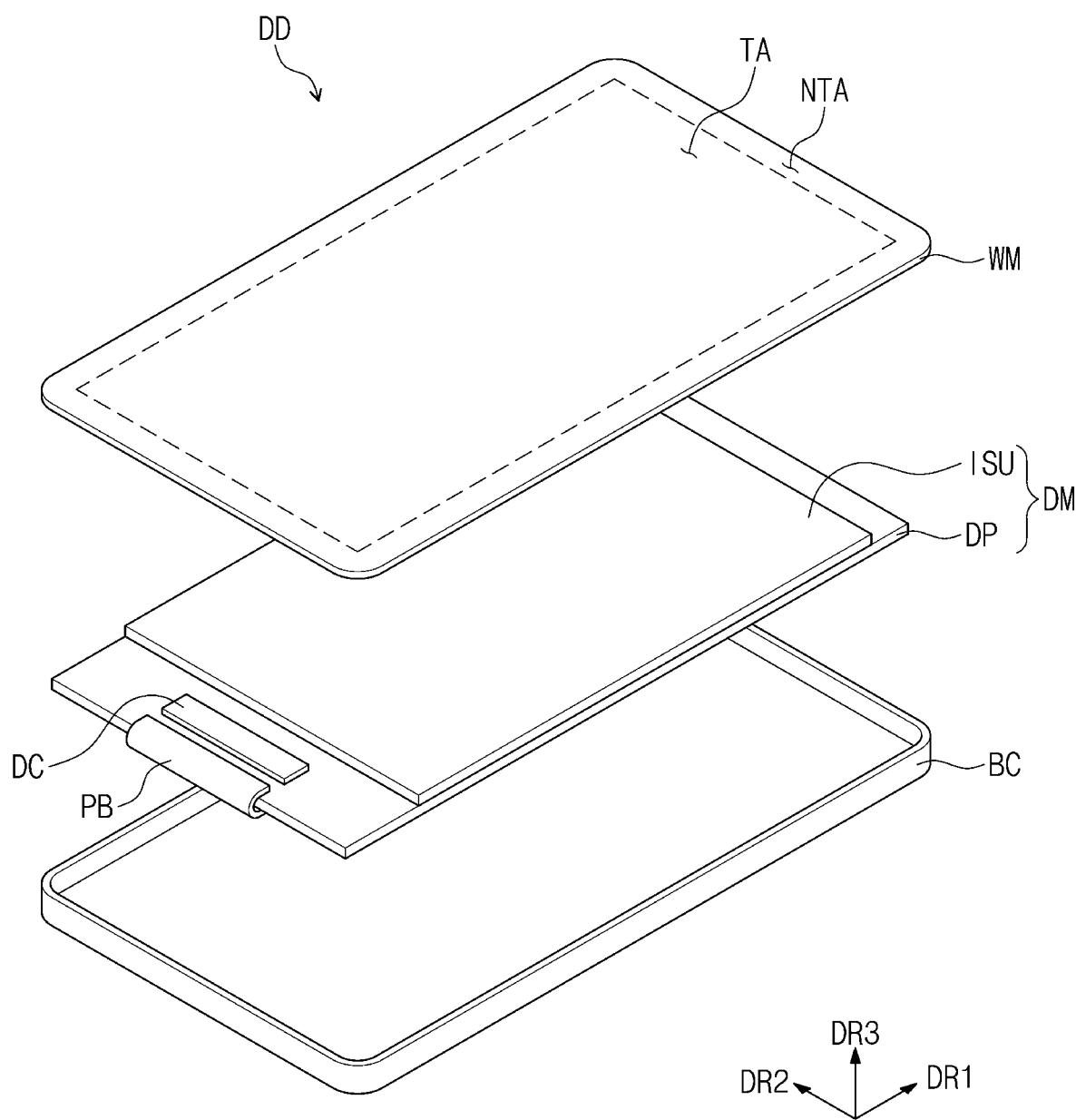
FIG. 2 is an exploded perspective view of the display device according to an embodiment of the inventive concept.
Figure 3:
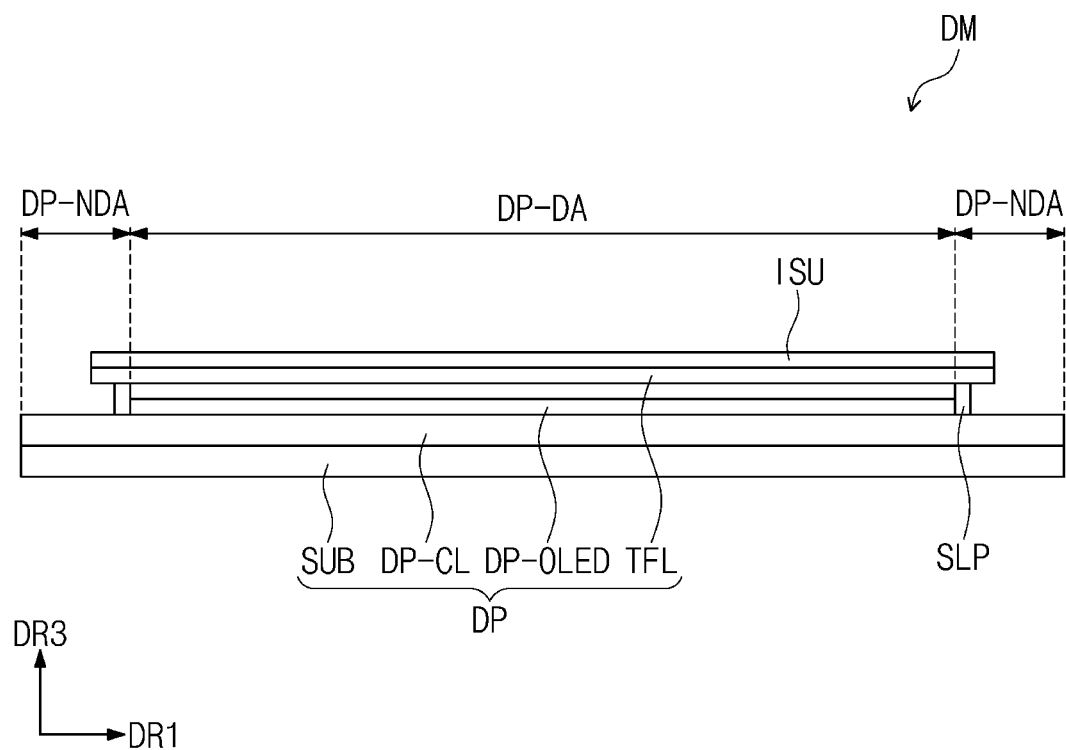
FIG. 3 is a cross-sectional view of an electronic panel according to an embodiment of the inventive concept.

FIG. 1 is a perspective view of a display device according to an embodiment of the inventive concept. FIG. 2 is an exploded perspective view of the display device according to an embodiment of the inventive concept. FIG. 3 is a cross-sectional view of an electronic panel according to an embodiment of the inventive concept.

In this specification, a display device DD that is capable of being applied to a mobile terminal is exemplarily illustrated. Although not shown, electronic modules, a camera module, a power module, and the like, which are mounted on a main board, may be disposed on a bracket/case together with the display device DD to constitute the mobile terminal. The display apparatus DD according to an embodiment of the inventive concept may be applied to large-sized electronic apparatuses such as televisions and monitors and small and middle-sized electronic apparatuses such as tablet PC, navigation units for vehicles, game consoles, and smart watches.

Referring to FIG. 1, a display device DD may display an image IM through a display surface DD-IS. Icon images are illustrated as an example of the image IM. The display surface DD-IS is parallel to a surface defined by a first direction DR1 and a second direction DR2. A normal direction of the display surface DD-IS, i.e., a thickness direction of the display device DD is indicated as a third direction DR3. In this specification, "when viewed on a plane or on the plane" may mean a case when viewed in the third direction DR3. A front surface (or a top surface) and a rear surface (or a bottom surface) of each of layers or units, which will be described below, are distinguished by the third direction DR3. However, directions indicated as the first to third directions DR1, DR2, and DR3 may be changed into different directions, for example, opposite directions as a relative concept.

Also, the display surface DD-IS includes a display area DD-DA on which an image IM is displayed and a non-display area DD-NDA that is adjacent to the display area DD-DA. The non-display area DD-NDA may be an area on which an image is not displayed. However, the inventive concept is not limited thereto. The non-display area DD-NDA may be adjacent to one side of the display area DD-DA or be omitted entirely.

Referring to FIG. 1 and FIG. 2, the display device DD may include a window WM, an electronic panel DM, a driving chip DC, a circuit board PB, and an accommodation member BC. The accommodation member BC may accommodate the electronic panel DM and be coupled to the window WM.

The window WM may be disposed above the electronic panel DM to transmit an image provided from the electronic panel DM to the outside. The window WM includes a transmission area TA and a non-transmission area NTA. The transmission area TA may have a shape that overlaps the display area DD-DA to correspond to the display area DD-DA. The image IM displayed on the display area DD-DA of the display device DD may be visible through the transmission area TA of the window WM from the outside.

The non-transmission area NTA may have a shape that overlaps the non-display area DD-NDA to correspond to the non-display area DD-NDA. The non-transmission area NTA may be an area having a light transmittance that is relatively less than that of the transmission area TA. However, the inventive concept is not limited thereto, and the non-transmission area NTA may be omitted.

The window WM may be made of glass, sapphire, or plastic. Also, although the window WM is provided as a single layer, the window WM may include a plurality of layers. The window WM may include a base layer and at least one printed layer overlapping the non-transmission area NTA and disposed on a rear surface of the base layer. The printed layer may have a predetermined color. For example, the printed layer may have a black color or colors other than the black color.

The electronic panel DM is disposed between the window WM and the accommodation member BC. The electronic panel DM includes a display panel DP and an input sensing layer ISU. The display panel DP generates an image and transmits the generated image to the window WM.

According to an embodiment of the inventive concept, the display panel DP may be an emission type display panel, but the inventive concept is not limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like.

Hereinafter, the display panel DP of the inventive concept is described as the organic light emitting display panel. However, the inventive concept is not limited thereto, and various display panels may be applied to the present disclosure according to embodiments.

Referring to FIG. 3, the display panel DP includes a base substrate SUB, a circuit element layer DP-CL disposed on the base substrate SUB, a display element layer DP-OLED, and an encapsulation layer TFL.

The electronic panel DM includes an active area DP-DA and a non-active area DP-NDA. The active area DP-DA of the display panel DP may correspond to the display area DD-DA of FIG. 1 or the transmission area TA of FIG. 2, and the non-active area DP-NDA may correspond to the non-display area DD-NDA of FIG. 1 or the non-transmission area NTA of FIG. 2.

The base substrate SUB may include at least one plastic film. The base substrate SUB may include a plastic substrate, a glass substrate, a metal substrate, or an organic/inorganic composite substrate as a flexible board.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of a pixel, and the like.

The display element layer DP-OLED may include a plurality of organic light emitting diodes. The display element layer DP-OLED may further include an organic layer such as a pixel defining layer. According to another embodiment, when the display panel is provided as a liquid crystal display panel, the display element layer may be provided as a liquid crystal layer.

The insulation layer TFL seals the display element layer DP-OLED. For example, the insulation layer TFL may be a thin film encapsulation layer. The insulation layer TFL protects the display element layer DP-OLED against foreign substances such as moisture, oxygen, and dust particles. However, the inventive concept is not limited thereto. For example, an encapsulation substrate may be provided instead of the insulation layer TFL. In this case, the encapsulation substrate may be opposite to the base substrate SUB, and the circuit element layer DP-CL and the display element layer DP-OLED may be disposed between the encapsulation substrate and the base substrate SUB.

The input sensing layer ISU may be disposed between the window WM and the display panel DP. The input sensing layer ISU senses an input applied from the outside. The input applied from the outside may be provided in various ways. For example, the external input includes various types of external inputs, such as a portion of user's body, a stylus pen, light, heat, a pressure, or the like. Also, an input through contact with the portion of the human body such as user's hands as well as adjacent or neighboring space touches (for example, hovering) may also be one form of the input.

The input sensing layer ISU may be directly disposed on the display panel DP. In this specification, that "a constituent A is directly disposed on a constituent B" may mean that an adhesive member is not disposed between the constituents A and B. In the present embodiment, the input sensing layer ISU may be manufactured together with the display panel DP through a continuous process. However, the inventive concept is not limited thereto. For example, the input sensing layer ISU may be provided as an individual panel and may then be coupled to the display panel DP through an adhesive layer.

Referring again to FIG. 1 and FIG. 2, the driving chip DC may overlap the non-display area DP-NDA and be disposed on the display panel DP. For example, the driving chip DC may generate a driving signal that is required for the operation of the display panel DP on the basis of the control signal transmitted from the circuit board PB. The driving chip DC may transmit the generated driving signal to the circuit element layer DP-CL of the display panel DP. In this specification, the driving chip DC may be described as an electronic component.

The circuit board PB may be disposed on an end of the base substrate SUB and be electrically connected to the circuit element layer DP-CL. The circuit board PB may be rigid or flexible. For example, when the circuit board PB is flexible, the circuit board PCB may be provided as a flexible printed circuit board. The circuit board PB may include a timing control circuit that controls an operation of the display panel DP. The timing control circuit may be mounted in the form of an integrated chip on the circuit board PB. Also, the circuit board PB may include an input sensing circuit that controls the input sensing layer ISU.

Figure 4:
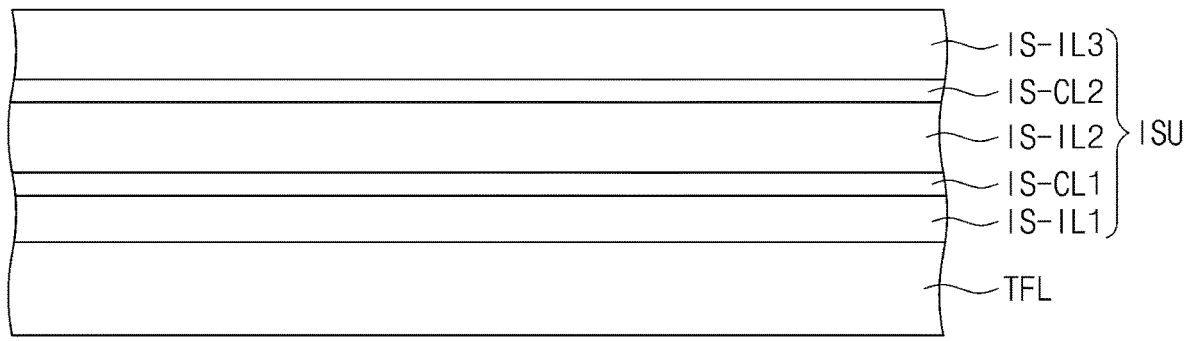
FIG. 4 is a cross-sectional view of an input sensing layer according to an embodiment of the inventive concept.

FIG. 4 is a cross-sectional view of the input sensing layer according to an embodiment of the inventive concept.

Referring to FIG. 4, the input sensing layer ISU includes a first sensing insulation layer IS-IL1, a first conductive layer IS-CL1, a second sensing insulation layer IS-IL2, a second conductive layer IS-CL2, and a third sensing insulation layer IS-IL3. The first sensing insulation layer IS-IL1 may be directly disposed on the insulation layer TFL. However, the inventive concept is not limited thereto, and thus, the first sensing insulation layer IS-IL1 may be omitted. In this case, the first conductive layer IS-CL1 may be disposed directly on the insulation layer TFL.

Each of the first conductive layer IS-CL1 and the second conductive layer IS-CL2 may have a single-layer structure or a multi-layered structure in which a plurality of layers are stacked in the third direction DR3 (refer to FIG. 3). The conductive layer having a multi-layered structure may include at least two or more layers of transparent conductive layers and metal layers. The conductive layer having the multi-layered structure may include metal layers including metals different from each other.

According to an embodiment of the inventive concept, the first conductive layer IS-CL1 may include molybdenum, silver, titanium, copper, aluminum, and alloys thereof. For example, the first conductive layer IS-CL1 may have a three-layered structure of titanium/aluminum/titanium, which is a metal layer structure. Here, a metal having relatively high durability and low reflectivity may be applied to an outer layer, and a metal having high electrical conductivity may be applied to an inner layer. The second conductive layer IS-CL2 may be a transparent conductive layer such as indium tin oxide (ITO), indium zinc oxide (IZO), zinc oxide (ZnO), indium tin zinc oxide (ITZO), PEDOT, metal nanowires, graphene, and the like.

However, the inventive concept is not limited thereto. For example, the conductive layers included in the first conductive layer IS-CL1 and the second conductive layer IS-CL2 may be variously modified. For example, the first conductive layer IS-CL1 may be a transparent conductive layer, and the second conductive layer IS-CL2 may be a metal layer.

Each of the first and second insulation layers IS-IL1 and IS-IL2 may include an inorganic or organic layer. In this embodiment, the first sensing insulation layer IS-IL1 may be an inorganic layer. However, the inventive concept is not limited thereto. For example, each of the first sensing insulation layer IS-IL1 and the second sensing insulation layer IS-IL2 may be provided as the inorganic layer, and the third sensing insulation layer IS-IL3 may be provided as the organic layer.

Figure 5:
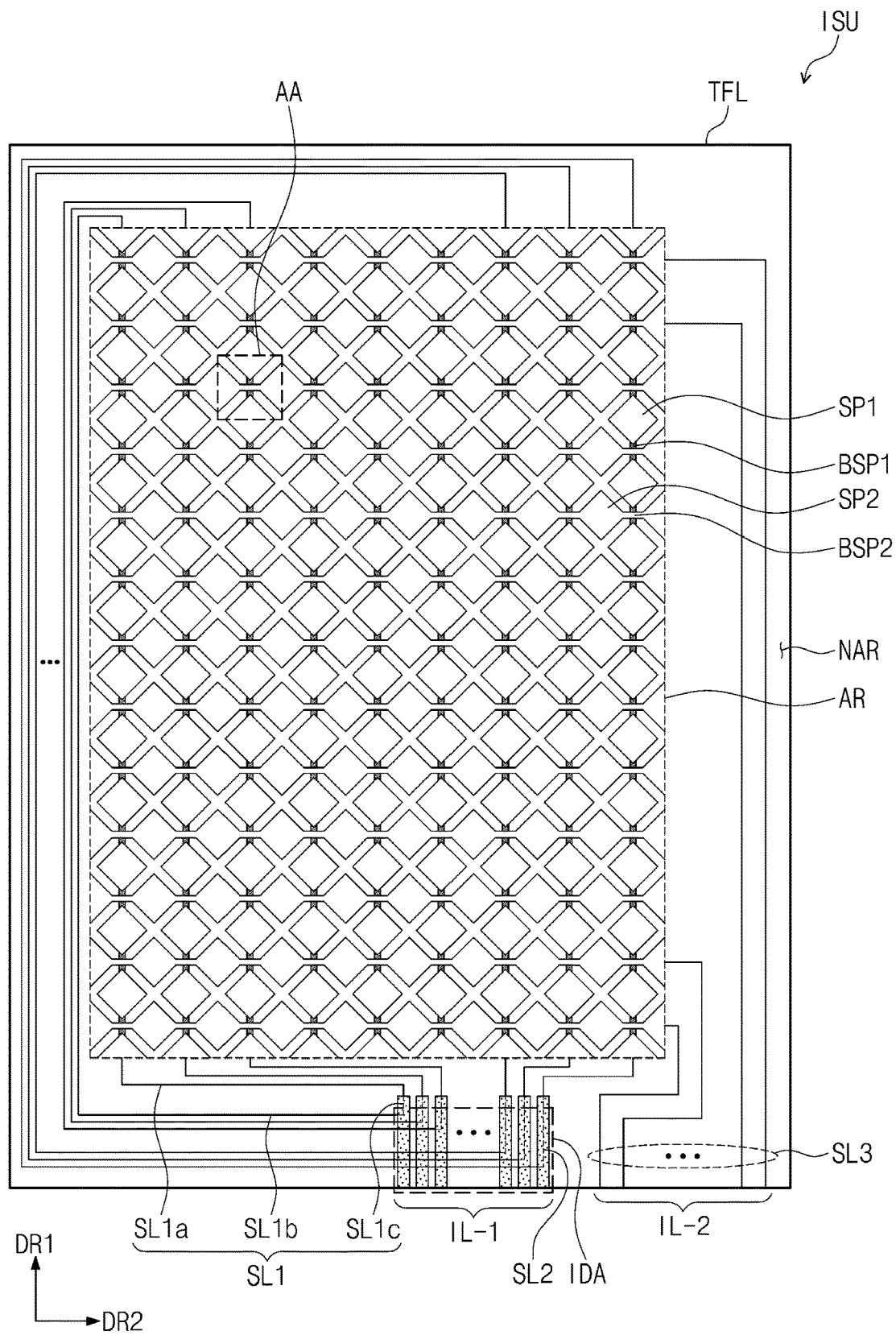
FIG. 5 is a plan view of the input sensing layer according to an embodiment of the inventive concept.
Figure 6:
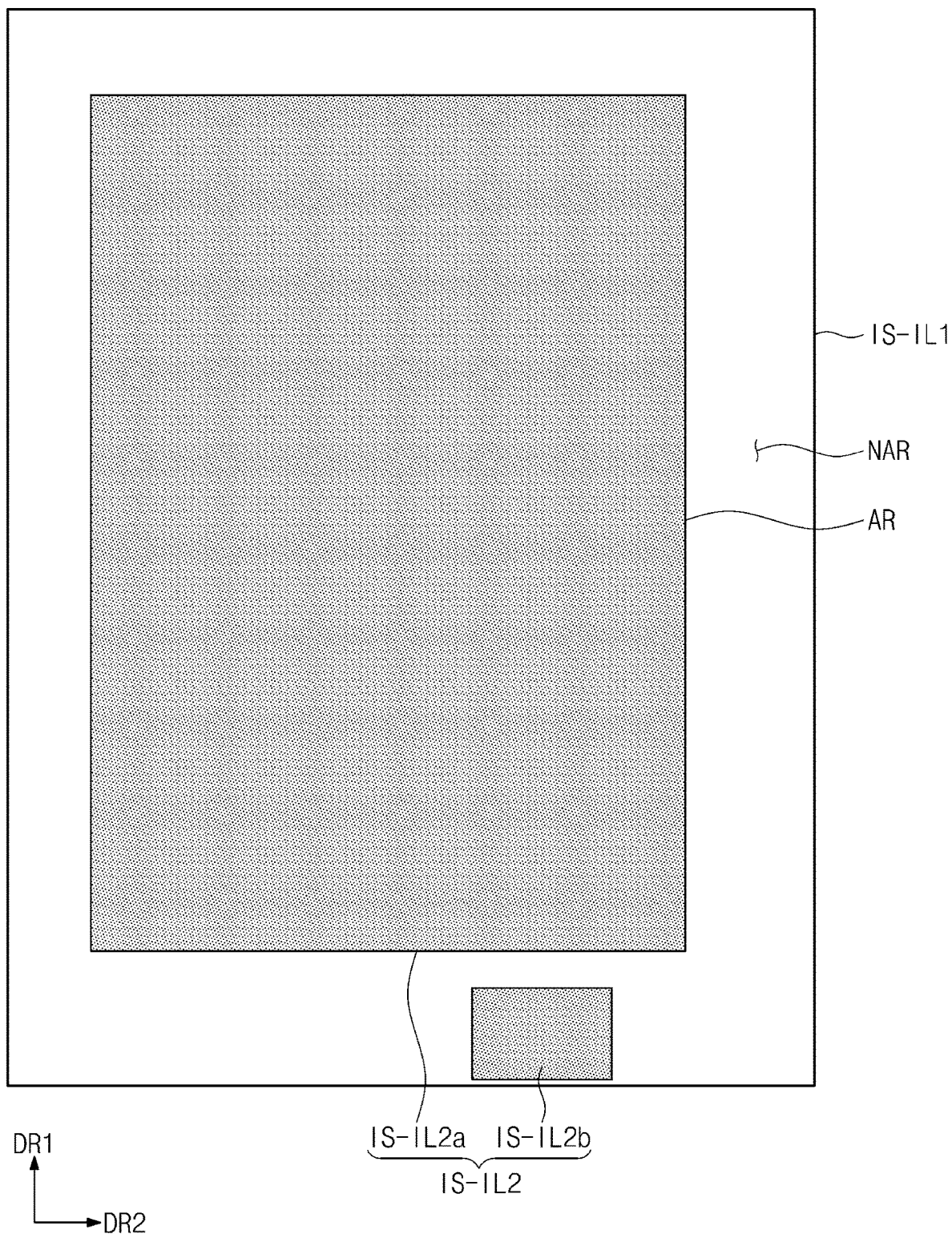
FIG. 6 is a plan view of a sensing insulation layer provided in the input sensing layer according to an embodiment of the inventive concept.

FIG. 5 is a plan view of the input sensing layer according to an embodiment of the inventive concept. FIG. 6 is a plan view of a sensing insulation layer included in the input sensing layer according to an embodiment of the inventive concept.

Referring to FIG. 5, the input sensing layer ISU includes a sensing area AR and a peripheral area NAR adjacent to the sensing area AR. The sensing area AR of the input sensing layer ISU may overlap the active area DP-DA of the display panel DP described above. The non-active area DP-NDA of the display panel DP may overlap the peripheral area NAR of the input sensing layer ISU. The sensing area AR may be an area on which an input applied from the outside is sensed.

The input sensing layer ISU includes first sensing electrodes, second sensing electrodes, first connection patterns BSP1, second connection patterns BSP2, a first line part IL-1, and a second line part IL-2. The first sensing electrodes, the second sensing electrodes, the first connection patterns BSP1, and the second connection patterns BSP2 overlap the sensing area AR, and the first line part IL-1 and the second line part IL-2 overlap the peripheral area NAR.

The first sensing electrodes extend in the first direction DR1 and are arranged in the second direction DR2. Also, n first sensing electrodes may be provided (where n is a natural number). Each of the first sensing electrodes may include a plurality of first sensing patterns SP1 spaced apart from each other on the plane and arranged in the first direction DR1.

M second sensing electrodes may be provided (where m is a natural number), which extend in the second direction DR2 and are arranged in the first direction DR1. Each of the second sensing electrodes may include a plurality of second sensing patterns SP2 spaced apart from each other on the plane and arranged in the second direction DR2. The second sensing patterns SP2 may be spaced apart from and insulated from the first sensing patterns SP1 on the plane.

The first connection patterns BSP1 may electrically connect the first sensing patterns SP1 to each other. For example, one first connection pattern BSP1 may electrically connect two first sensing patterns SP1, which are adjacent to each other in the first direction DR1, of the first sensing patterns SP1 to each other.

The second connection patterns BSP2 may electrically connect the second sensing patterns SP2 to each other. For example, one second connection pattern BSP2 may electrically connect two second sensing patterns SP2, which are adjacent to each other in the second direction DR2, of the second sensing patterns SP2 to each other. The first connection pattern BSP1 and the second connection pattern BSP2 may cross each other on the plane and be insulated from each other in a cross-section.

According to an embodiment of the inventive concept, the first sensing patterns SP1, the second sensing patterns SP2, and the second connection patterns BSP2 may be formed through the same process and material and may also be included in the second conductive layer IS-CL2 that is described with reference to FIG. 4. That is to say, the first sensing patterns SP1, the second sensing patterns SP2, and the second connection patterns BSP2 may be directly disposed on the second sensing insulation layer IS-IL2.

Particularly, each of the first sensing patterns SP1, the second sensing patterns SP2, and the second connection patterns BSP2 may include transparent conductive oxide. For example, the transparent conductive oxide may include at least one of indium zinc oxide (IZO), indium tin oxide (ITO), indium gallium oxide (IGO), indium zinc gallium oxide (IGZO), or a mixture/compound thereof.

According to an embodiment of the inventive concept, the first connection patterns BSP1 may be included in the first conductive layer IS-CL1 described with reference to FIG. 4. The first connection patterns BSP1 may be directly disposed on the first sensing insulation layer IS-IL1. In this specification, the first sensing insulation layer IS-IL1 may be described as the base layer of the input sensing layer ISU defining the sensing area AR and the peripheral area NAR. The first connection patterns BSP1 may be electrically connected to the first sensing patterns SP1 through contact holes defined in the second sensing insulation layer IS-IL2.

The first connection patterns BSP1 may include a material different from those of the components included in the second conductive layer IS-CL2. For example, the first connection patterns BSP1 may include a metal material.

The first line part IL-1 includes first sensing lines SL1 electrically connected to one end and the other end of each of the first sensing electrodes. The first sensing lines SL1 include first sub-lines SL1a, second sub-lines SL1b, and connection lines SL1c. Each of the first sub-lines SL1a is connected to one end of each of the first sensing electrodes, and each of the second sub-lines SL1b is connected to the other end of each of the first sensing electrodes. The connection lines SL1c are disposed between the first sub-lines SL1a and the second sub-lines SL1b to electrically connect the first sub-lines SL1a to the second sub-lines SL1b.

Actually, the first sensing lines SL1 may be included in the first conductive layer IS-CL1, and disposed on the first sensing insulation layer IS-IL1 through the same process and the same material as the first connection patterns BSP1. That is, each of the first sub-lines SL1a, the second sub-lines SL1b, and the connection lines SL1c include a metal material may have one integrated shape formed on the first sensing insulation layer IS-IL1.

The second sensing lines SL2 extend in the first direction DR1 and may be disposed on a different layer from the first sensing lines SL1. For example, the second sensing lines SL2 may be disposed on the second sensing insulation layer IS-IL2 overlapping the peripheral area NAR through the same material and process as the sensing electrodes included in the second conductive layer IS-CL2. The second sensing lines SL2 may be electrically connected to the connection lines SL1c of the first sensing lines SL1 through contact holes defined in the second sensing insulation layer IS-IL2 overlapping the peripheral area NAR.

In detail, referring to FIG. 6, the second sensing insulation layer IS-IL2 includes a first insulation portion IS-IL2a overlapping the sensing area AR and a second insulation portion IS-IL2b overlapping the peripheral region NAR. The second insulation portion IS-IL2b has a surface area less than that of the first insulation portion IS-IL2a on the plane and may be spaced apart from the first insulation portion IS-IL2a.

The first insulation portion IS-IL2a may overlap the first sensing electrodes and the second sensing electrodes, which are included in the second conductive layer IS-CL2, and may be disposed on the first conductive layer IS-CL1. A plurality of contact holes through which the first sensing electrodes and the first connection patterns BSP1 are electrically connected to each other may be defined in the first insulation portion IS-IL2a.

The second insulation portion IS-IL2b may cover at least a portion of each of the first sensing lines SL1. For example, the second insulation portion IS-IL2b may cover the connection lines SL1c of the first sensing lines SL1 and may be disposed on the first conductive layer IS-CL1. The second sensing lines SL2 may be disposed on the second insulation portion IS-IL2b and may be electrically connected to the connection lines SL1c through the contact holes defined in the second insulation portion IS-IL2b, respectively.

Referring again to FIG. 5, the second sensing lines SL2 may be bonded to an external circuit board to receive an electrical signal from the outside. Each of the second sensing lines SL2 may include a first line portion bonded to the external circuit board and a second line portion overlapping the connection lines SL1c of the first sensing lines SL1. The electrical signal received to the second sensing lines SL2 may be transmitted to the connection lines SL1c through the contact holes defined in the second insulation portion IS-IL2b. As a result, the electrical signals may be transmitted to one end and the other end of each of the first sensing electrodes through the first sub-lines SL1a and the second sub-lines SL1b, which are adjacent to both ends of the connection lines SL1c.

The second line part IL-2 may include third sensing lines SL3 respectively electrically connected to the second sensing electrodes. One end of each of the third sensing lines SL3 may be connected to each of the second sensing electrodes, and the other end of each of the third sensing lines SL3 may receive an electrical signal required for driving the input sensing layer ISU from the outside. The other end of the third sensing lines SL3 may be aligned with ends of the connection lines SL1c. The third sensing lines SL3 may include a metal material and be formed through the same process as the first sensing lines SL1.

In addition, the second insulation portion IS-IL2b illustrated in FIG. 6 may cover a portion of each of the third sensing lines SL3. In this case, although not shown, signal lines electrically connected to the third sensing lines SL3 and bonded to the external circuit board may be disposed on the second insulation portion IS-IL2b.

According to an embodiment of the inventive concept, each of the second sub-lines SL1b may partially overlap at least one or more second sensing lines SL2 of the second sensing lines SL2. That is to say, one second sub-line SL1b of the second sub-lines SL1b may cross one second sense line SL2 of the second sense lines SL2 on the plane.

The one second sub-line SL1b and the one second sensing line SL2, which cross each other on the plane may be insulated from each other through the second insulation portion IS-IL2b. As a result, short circuits between the one second sub-line SL1b and the one of the second sensing lines SL2 may be prevented. This will be described in more detail with reference to FIG. 9.

An electrical signal may be received from the outside through the second sensing lines SL2 disposed on the second insulation portion IS-IL2b. Also, external static electricity in addition to the electrical signal may be received to the second sensing lines SL2. In this case, the external static electricity received to the second sensing lines SL2 may be transmitted to the connection lines SL1c through the contact holes defined in the second insulation portion IS-IL2b. As a result, the external static electricity may be transmitted to each of the first sub-lines SL1a and the second sub-lines SL1b which are adjacent to the connection lines SL1c, and a damage to the sensing lines and the sensing electrodes connected thereto may occur.

According to an embodiment of the inventive concept, the connection lines SL1c electrically connected to the second sensing lines SL2 disposed on the second insulation portion IS-IL2b may have a meandering shape on the plane. An intensity of external static electricity is inversely proportional to a length of the signal line. As a result, the connection lines SL1c according to the inventive concept may increase in length through a curved or zigzag shape as compared to a single straight shape on the same planer area. For example, each of the connection lines SL1c may have a zigzag shape that is bent at least twice or a curved shape that is bent at least twice. This will be described in more detail with reference to FIG. 9.

Figure 7:
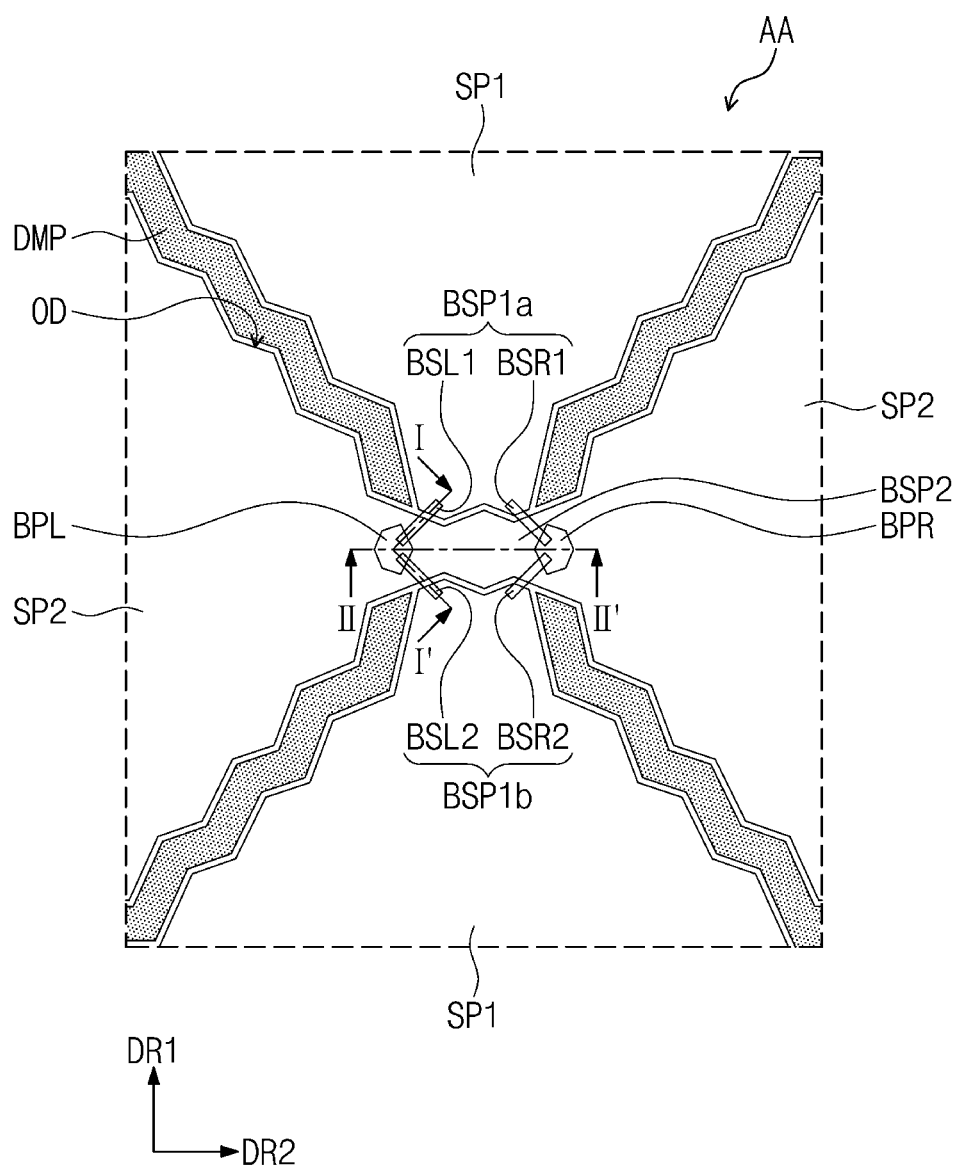
FIG. 7 is an enlarged view of an area AA of FIG. 5 according to an embodiment of the inventive concept.
Figure 8A:
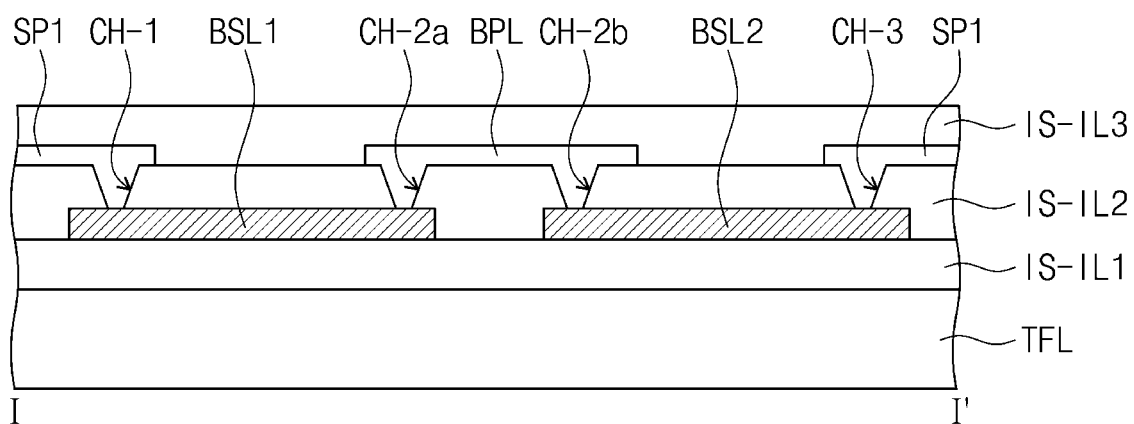
FIG. 8A is a cross-sectional view taken along line I-I' of FIG. 7.
Figure 8B:
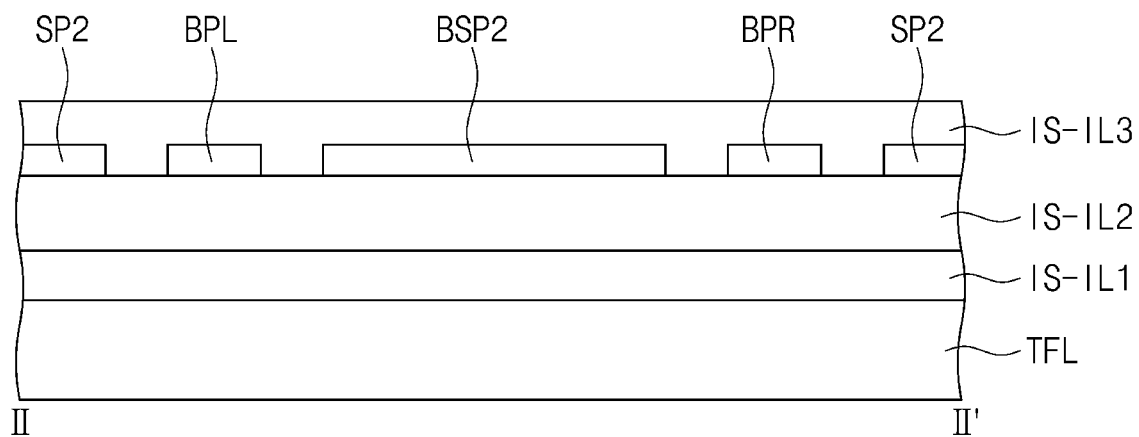
FIG. 8B is a cross-sectional view taken along line II-IF of FIG. 7.

FIG. 7 is an enlarged view of an area AA of FIG. 5 according to an embodiment of the inventive concept. FIG. 8A is a cross-sectional view taken along line I-I' of FIG. 7. FIG. 8B is a cross-sectional view taken along line II-IF of FIG. 7.

Referring to FIG. 5 and FIG. 7, two first sensing patterns SP1 facing each other in the first direction DR1, two second sensing patterns SP2 facing each other in the second direction DR2, the first connection pattern BSP1, the second connection pattern BSP2, first auxiliary pattern BPL, and second auxiliary pattern BPR are exemplarily illustrated.

The first and second auxiliary patterns BPL and BPR may be disposed between the two first sensing patterns SP1 and be spaced apart from the first sensing patterns SP1 on the plane. The first and second auxiliary patterns BPL and BPR are spaced from each other.

According to the inventive concept, the first and second auxiliary patterns BPL and BPR may be disposed on the same layer as the first sensing patterns SP1 and the second sensing patterns SP2. For example, the first and second auxiliary patterns BPL and BPR may be disposed on the second sensing insulation layer IS-IL2 through the same process and material as the first sensing patterns SP1 and the second sensing patterns SP2.

The first connection pattern BSP1 may electrically connect the two first sensing patterns SP1 spaced apart from each other to each other by using the first and second auxiliary patterns BPL and BPR. Hereinafter, for convenience of description, the first sensing pattern disposed on an upper side of the first connection pattern BSP1 is referred to as an upper first sensing pattern SP1, and the first sensing pattern disposed on a lower side is referred to as a lower first sensing pattern SP1. The first connection pattern BSP1 includes a first branch part BSP1a and a second branch part BSP1b, which are at least partially overlapped the second connection pattern BSP2.

The first branch part BSP1a includes a first sub-branch part BSL1 and a second sub-branch part BSR1, which are spaced apart from each other. The first sub-branch part BSL1 has one end and the other end, which are electrically connected to the upper first sensing pattern SP1 and the first auxiliary pattern BPL through the contact holes defined in the second sensing insulation layer IS-IL2 (see FIG. 4), respectively. The second sub-branch part BSR1 has one end and the other end, which are electrically connected to the upper first sensing pattern SP1 and the second auxiliary pattern BPR through the contact holes defined in the second sensing insulation layer IS-IL2, respectively.

The second branch part BSP1b includes a third sub-branch part BSL2 and a fourth sub-branch part BSR2, which are spaced apart from each other. The third sub-branch part BSL2 has one end and the other end, which are electrically connected to the lower first sensing pattern SP1 and the first auxiliary pattern BPL through the contact holes defined in the second sensing insulation layer IS-IL2, respectively. The fourth sub-branch part BSR2 has one end and the other end, which are electrically connected to the lower first sensing pattern SP1 and the second auxiliary pattern BPR through the contact holes defined in the second sensing insulation layer IS-IL2, respectively.

As described above, the first sub-branch part BSL1 electrically connects the first auxiliary pattern BPL to the upper first sensing pattern SP1, and the third sub-branch part BSL2 electrically connects the first auxiliary pattern BPL to the lower first sensing pattern SP1. Similarly, the second sub-branch part BSL2 electrically connects the second auxiliary pattern BPR to the upper first sensing pattern SP1, and the fourth sub-branch part BSR2 electrically connects the second auxiliary pattern BPR to the lower first sensing pattern SP1. As a result, the upper first sensing pattern SP1 and the lower first sensing pattern SP1 may be electrically connected to each other.

According to an embodiment of the inventive concept, a dummy pattern DMP may be disposed between the first sensing patterns SP1 and the second sensing patterns SP2 on the plane. The dummy pattern DMP may be spaced apart from the first sensing patterns SP1 and the second sensing patterns SP2. A spaced space OD is provided between the dummy pattern DMP and the first sensing patterns SP1 and between the dummy pattern DMP and the second sensing patterns SP2. That is, the dummy pattern DMP may be a floating pattern that is spaced apart from each of the first sensing patterns SP1 and the second sensing patterns SP2. The dummy pattern DMP may prevent gaps between the first sensing patterns SP1 and the second sensing patterns SP2 from being visible.

Also, as illustrated in FIG. 7, although each of the first sensing patterns SP1, the second sensing patterns SP2, and the dummy pattern DMP is provided in a stair shape, the inventive concept is not limited thereto. For example, each of the first sensing patterns SP1, the second sensing patterns SP2, and the dummy pattern DMP may have a linear shape or a groove shape. Since the dummy pattern DMP has the stair shape, a sensing surface area for the external input may increase compared to the same surface area. Thus, the input sensing unit having improved touch sensitivity may be provided.

Referring to FIG. 8A, a structure in which two first sensing patterns SP1 spaced apart from each other are electrically connected to each other through the first sub-branch part BSL1 and the third sub-branch part BSL2 is illustrated.

The second sensing insulation layer IS-IL2 covers the first sub-branch part BSL1 and the third sub-branch part BSL2 and is disposed on the first sensing insulation layer IS-IL1. Also, the second sensing insulation layer IS-IL2 defines a first contact hole CH-1, second contact holes CH-2a and CH-2b, and a third contact hole CH-3.

The two first sensing patterns SP1, which are spaced apart from each other, and the first auxiliary pattern BPL are disposed on the second sensing insulation layer IS-IL2. Particularly, one of the two first sensing patterns SP1 is electrically connected to the first sub-branch part BSL1 through the first contact hole CH-1, and the other of the two first sensing patterns SP1 is electrically connected to the third sub-branch part BSL2 through the third contact hole CH-3. The first auxiliary pattern BPL is electrically connected to the first sub-branch part BSL1 and the third sub-branch part BSL2 through the second contact holes CH-2a and CH-2b.

The third sensing insulation layer IS-IL3 covers two first sensing patterns SP1, which are spaced part from each other, and the first auxiliary pattern BPL and is disposed on the second sensing insulation layer IS-IL2.

Referring to FIG. 8B, the first auxiliary pattern BPL, the second auxiliary pattern BPR, the second sensing patterns SP2, and the second connecting patterns BSP2 may be disposed on the second sensing insulation layer IS-IL2 that is the same layer as the above-described patterns. According to the inventive concept, the first auxiliary pattern BPL and the second auxiliary pattern BPR may be spaced apart from the second sensing patterns SP2 and the second connection patterns BSP2 on the plane. That is, the first auxiliary pattern BPL and the second auxiliary pattern BPR may have a structure that is electrically insulated from the second sensing patterns SP2 and the second connection patterns BSP2.

Figure 9:
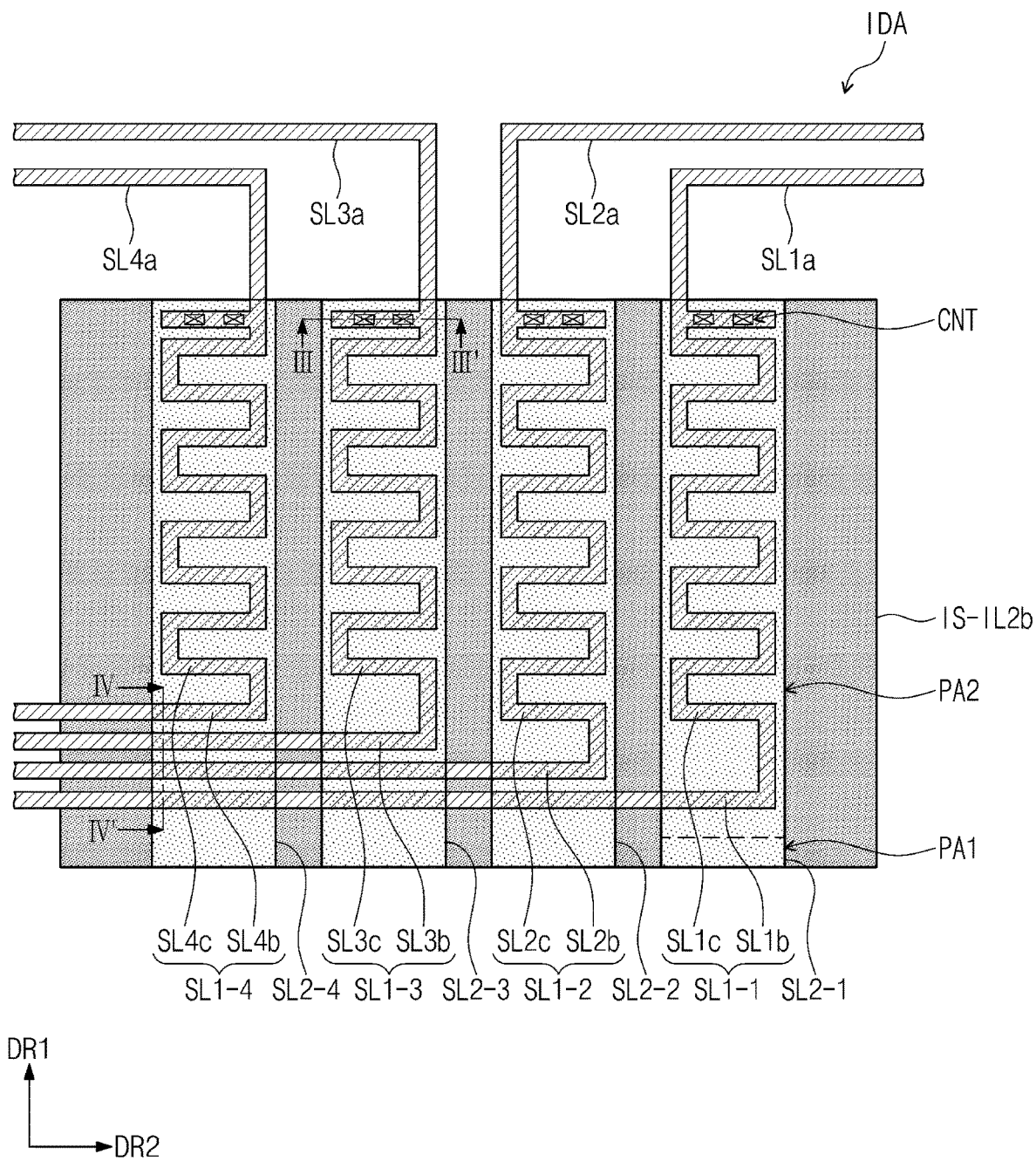
FIG. 9 is an enlarged view of an area IDA of FIG. 5 according to an embodiment of the inventive concept.
Figure 11:
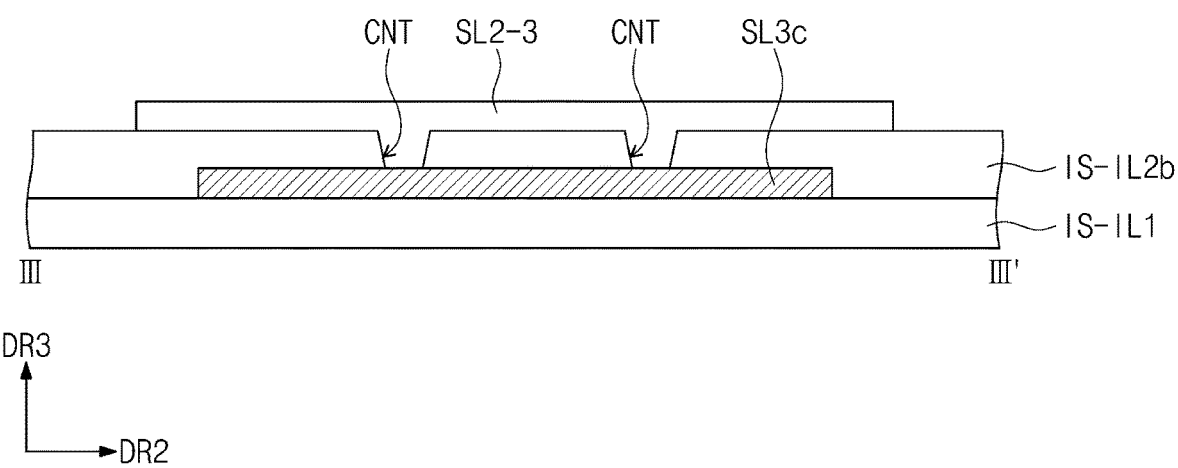
FIG. 11 is a cross-sectional view taken along line of FIG. 9 according to an embodiment of the inventive concept.
Figure 12:
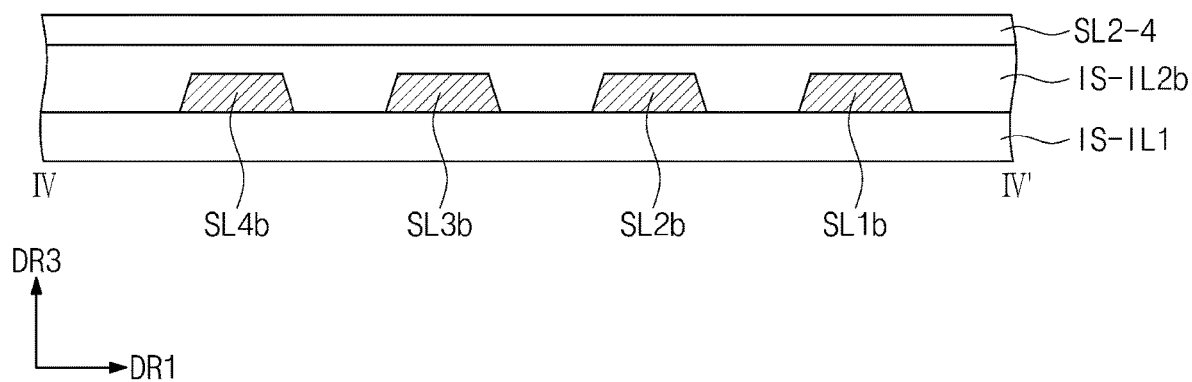
FIG. 12 is a cross-sectional view taken along line IV-IV' of FIG. 9 according to an embodiment of the inventive concept.

FIG. 9 is an enlarged view of an area IDA of FIG. 5 according to an embodiment of the inventive concept. FIG. 10 is a plan view illustrating one connection line of connection lines of FIG. 9 according to an embodiment of the inventive concept. FIG. 11 is a cross-sectional view taken along line of FIG. 9 according to an embodiment of the inventive concept. FIG. 12 is a cross-sectional view taken along line IV-IV' of FIG. 9 according to an embodiment of the inventive concept.

Referring to FIG. 9, four first sensing lines SL1-1, SL1-2, SL1-3, and SL1-4 of the first sensing lines SL1 illustrated in FIG. 5 and four second sensing lines SL2-1, SL2-2, SL2-3, and SL2-4 of the second sensing lines SL2 are exemplarily illustrated. The first sensing lines SL1-1, SL1-2, SL1-3, and SL1-4 may be electrically connected to the second sensing lines SL2-1, SL2-2, SL2-3, and SL2-4, respectively. According to the inventive concept, the second sensing lines SL2 may have a planar area per unit length, which is greater than that of the first sensing lines SL1.

The first sensing line SL1-1 in a first column includes a first sub-line SL1a, a second sub-line SL1b, and a connection line SL1c. The second sensing line SL2-1 in the first column is disposed on a different layer from the first sensing line SL1-1 in the first column. The second sensing line SL2-1 in the first column may be electrically connected to the connection line SL1c through the contact hole defined in the second insulation portion IS-IL2b of the second insulation layer IS-IL2 (see FIG. 6).

The first sensing line SL1-2 in a second column includes a first sub-line SL2a, a second sub-line SL2b, and a connection line SL2c. The second sensing line SL2-2 in the second column may be disposed on a different layer from the first sensing line SL1-2 in the second column and be electrically connected to the connection line SL2c through the contact hole defined in the second insulation portion IS-IL2b.

The first sensing line SL1-3 in a third column includes a first sub-line SL3a, a second sub-line SL3b, and a connection line SL3c. The second sensing line SL2-3 in the third column may be disposed on a different layer from the first sensing line SL1-3 in the third column and be electrically connected to the connection line SL3c through the contact hole defined in the second insulation portion IS-IL2b.

The first sensing line SL1-4 in a fourth column includes a first sub-line SL4a, a second sub-line SL4b, and a connection line SL4c. The second sensing line SL2-4 in the fourth column may be disposed on a different layer from the first sensing line SL1-4 in the fourth column and be electrically connected to the connection line SL4c through the contact hole defined in the second insulation portion IS-IL2b.

Each of the first sub-lines SL1a to SL4a may be respectively connected to one end of each of the first sensing electrodes and may have a structure in which the first sub-lines SL1a to S14a do not overlap the second sensing insulation layer IS-IL2. However, the inventive concept is not limited thereto, and at least a portion of each of the first sub-lines SL1a to SL4a may overlap the second insulation portion IS-IL2b. For example, one end of each of the first sub-lines SL1a to SL4a may overlap the second insulation portion IS-IL2b, and the other end of each of the first sub-lines SL1a to SL4a may overlap the first insulation portion IS-IL2a so as to be connected to one end of each of the first sensing electrodes. One end and the other end of each of the first sub-lines SL1a to SL4a may not overlap the second sensing insulation layer IS-IL2 therebetween.

The second sub-lines SL1b to SL4b may be connected to the other ends of the first sensing electrodes, respectively. Particularly, according to the inventive concept, one of the second sub-lines SL1b to SL4b may overlap at least one of the second sensing lines SL2-1 to SL2-4. For example, the second sub-line SL1b in the first column, which is illustrated in FIG. 9, may extend in the second direction DR2 to cross the second sensing lines SL2-1 to SL2-4 extending in a first direction DR1 on the plane. For another example, the second sub-line SL2b in the second column may extend in the second direction DR2 to cross the second sensing lines SL2-2 to SL2-4 extending in the first direction DR1 on the plane.

In this case, the second sub-line SL1b in the first column may be insulated from the second sensing lines SL2-1 to SL2-4 through the second insulation portion IS-IL2b. The second sub-line SL2b in the second column may be insulated from the second sensing lines SL2-2 to SL2-4 through the second insulation portion IS-IL2b.

According to an embodiment of the inventive concept, each of the connection lines SL1c to SL4c in the first to fourth columns may have the meandering shape. This is done because the connection line having the meandering shape has a length greater than that of the connection line having the single straight shape under the same surface area. Particularly, the connection lines SL1c to SL4c in the first-to-fourth columns may be connected to the second lines SL2-1 to SL2-4 through the contact hole CNT defined in the second insulation portion IS-IL2b, respectively.

Also, the connection lines SL1c to SL4c may be entirely covered by the second insulation portion IS-IL2b. The second sensing lines SL2-1 to SL2-4 may be disposed on the second insulation portion IS-IL2b and may be respectively connected to the connection lines SL1c to SL4c through the contact holes CNT.

Each of the second sensing lines SL2-1 to SL2-4 has a shape extending in the first direction DR1, and the second sensing lines SL2-1 to SL2-4 may have substantially the same surface area on the plane. That is, the second sensing lines SL2-1 to SL2-4 may have the same length in the first direction DR1. In this specification, substantially the same surface area and the same length may be described as including a process error.

According to the inventive concept, the contact holes CNT defined in the second insulation portion IS-IL2b may be defined in the same line in the second direction DR2. Particularly, each of the connection lines SL1c to SL4c may be disposed between the corresponding one contact hole CNT of the contact holes CNT and the corresponding second sub-line of the second sub-lines SL1b to SL4b. In the plane, the one contact hole CNT may be defined in the second insulation portion IS-IL2b adjacent to an end of the corresponding second sensing line of the second sensing lines SL2-1 to SL2-4.

In addition, as described above, each of the second sensing lines SL2-1 to SL2-4 includes a first line portion PA1 bonded to the external circuit board and a second line portion PA2 overlapping the corresponding connection line of the connection lines SL1c to SL4c. In this case, the ends of the second sensing lines SL2-1 to SL2-4 may be defined as an end of the second line portion PA2 that is most spaced apart from the first line portion PA1 in the first direction DR1.

For example, the connection line SL1c in the first column may be disposed between the contact hole CNT in the first column and the second sub-line SL1b in the first column and have a first length. The connection line SL2c in the second column may be disposed between the contact hole CNT in the second column and the second sub-line SL1b in the second column and have a second length less than the first length. The reason in which the second length is less than the first length is that the distance between the second sub-line SL2b and the contact hole CNT in the second column is smaller than the distance between the second sub-line SL1b and the contact hole CNT in the first column As described above, external static electricity may be transmitted to the connection lines SL1c to SL4c in the first to fourth columns through the contact hole CNT. According to the inventive concept, since each of the connection lines SL1c to SL4c in the first to fourth columns has the meandering shape, a time taken to transmit the external static electricity to the first sub-lines SL1a to SL4a and the second sub-lines SL1b to SL4b may increase. As a result, an intensity of the external static electricity may also be weakened.

Figure 10A:
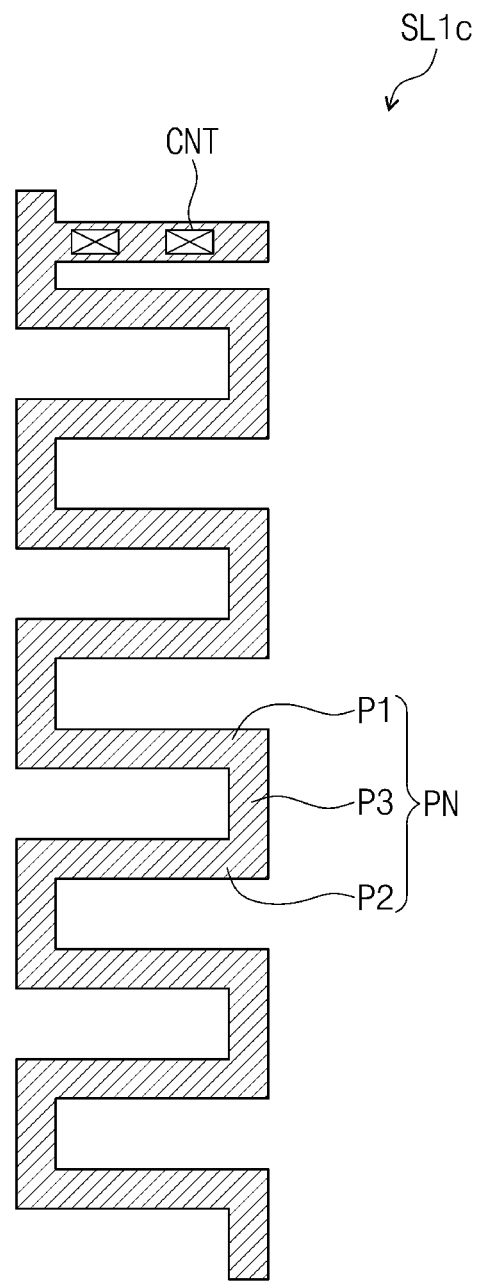
FIGS. 10A and 10B are plan views illustrating different shapes for one connection line of connection lines of FIG. 9 according to an embodiment of the inventive concept.

In detail, according to an embodiment illustrated in FIG. 10A, although one connection line SL1c of the connection lines SL1c to SL4c is exemplarily illustrated, the other connection lines SL2c to SL4c may also have the same structure.

The connection line SL1c includes a pattern PN that is bent at least twice. For example, the pattern PN includes a first portion P1, a second portion P2, and a third portion P3. The first portion P1 extends in the second direction DR2. The second portion P2 may extend in the second direction DR2 to face the first portion P1 in the first direction DR1. The third part P3 may extend in the first direction DR1 to connect the first part P1 to the second part P2. That is, the third portion P3 may be bent at one end of the first portion P1, and the second portion P2 may be bent at one end of the third portion P3.

According to an embodiment, the connection line SL1c may include at least one pattern PN. That is, the connection line SL1c may include a plurality of patterns PN connected to each other.

Figure 10B:
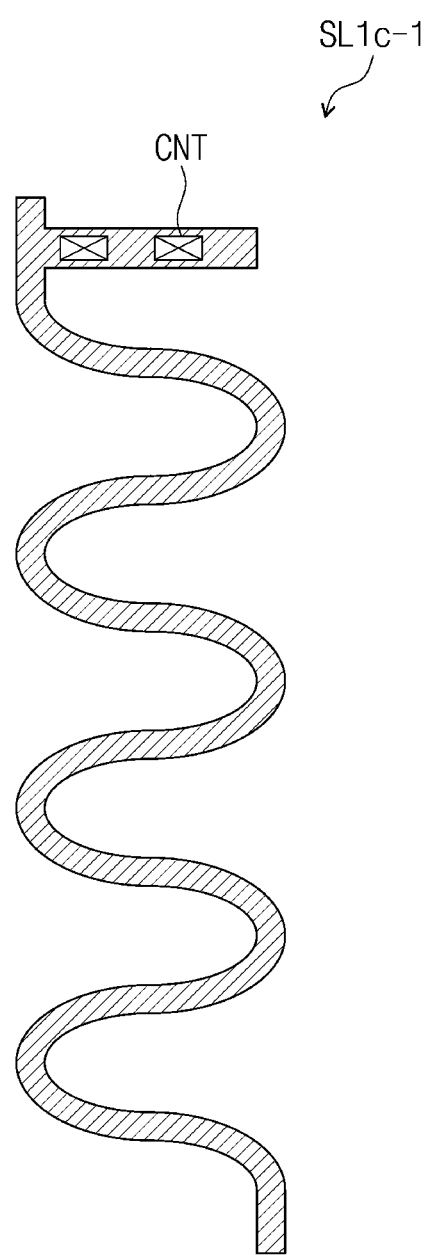

According to an embodiment illustrated in FIG. 9 and FIG. 10B, at least a portion of the connection line SL1c-1 may have a curved shape. One end and the other end of the curved connection line SL1c-1 may be connected to the first sub-line SL1a and the second sub-line SL1b.

Referring to FIG. 11, the connection line SL3c is disposed on the first sensing insulation layer IS-IL1. The second insulation portion IS-IL2b of the second sensing insulation layer IS-IL2 may cover the connection line SL3c and be disposed on the first sensing insulation layer IS-ILL The second sensing line SL2-3 may be electrically connected to the connection line SL3c through a plurality of contact holes CNT defined in the second insulation portion IS-IL2b.

Referring to FIG. 12, the second sub-lines SL1b to SL4b extending in the second direction DR2 may be disposed on the first sensing insulation layer IS-IL1. The second insulation portion IS-IL2b of the second sensing insulation layer IS-IL2 covers the second sub-lines SL1b to SL4b and is disposed on the first sensing insulation layer IS-IL1. In this case, the second sensing line SL2-4 in the fourth column may have a structure overlapping each of the second sub-lines SL1b to SL4b. Particularly, the second sensing line SL2-4 in the fourth column may cross the second sub-lines SL1b to SL4b on the plane.

Figure 13:
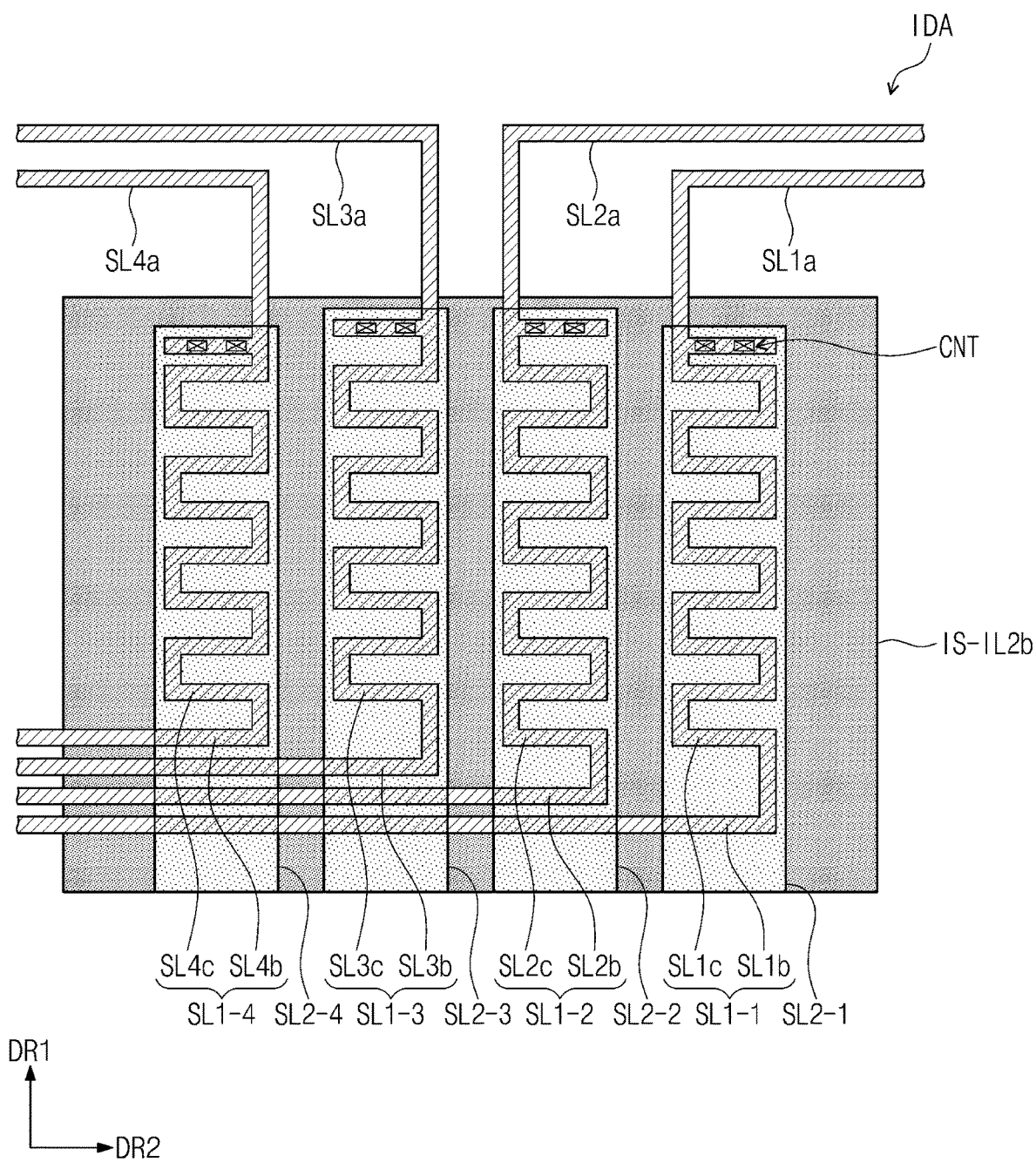
FIG. 13 is an enlarged view of an area IDA of FIG. 5 according to another embodiment of the inventive concept.

FIG. 13 is an enlarged view of an area IDA of FIG. 5 according to another embodiment of the inventive concept.

Referring to FIG. 13, at least two second sensing lines of second sensing lines SL2-1 to SL2-4 may have different surface areas on a plane. For example, the second sensing line SL2-1 in a first column may have a surface area less than that of the second sensing line SL2-2 in the second column on the plane. Also, contact holes CNT in the first column and contact holes CNT in a second column, which are defined in a second insulation portion IS-IL2b, may be located on different lines in the second direction DR2.

That is, according to the inventive concept, the contact hole CNT in the first column and the second sub-line SL1b in the first column may be provided to be maximally spaced apart from each other in the first direction DR1. As a result, a length of a connection line SL1c, which is disposed between the contact hole CNT in the first column and the second sub-line SL1b in the first column and has the meandering shape, may be set to be maximized.

Similarly, the contact hole CNT in the second column and the second sub-line SL1b in the second column may be provided to be maximally spaced apart from each other in the first direction DR1. As a result, a length of a connection line SL2c, which is disposed between the contact hole CNT in the second column and the second sub-line SL2b in the second column and has the meandering shape, may be set to be maximized.

Figure 14:
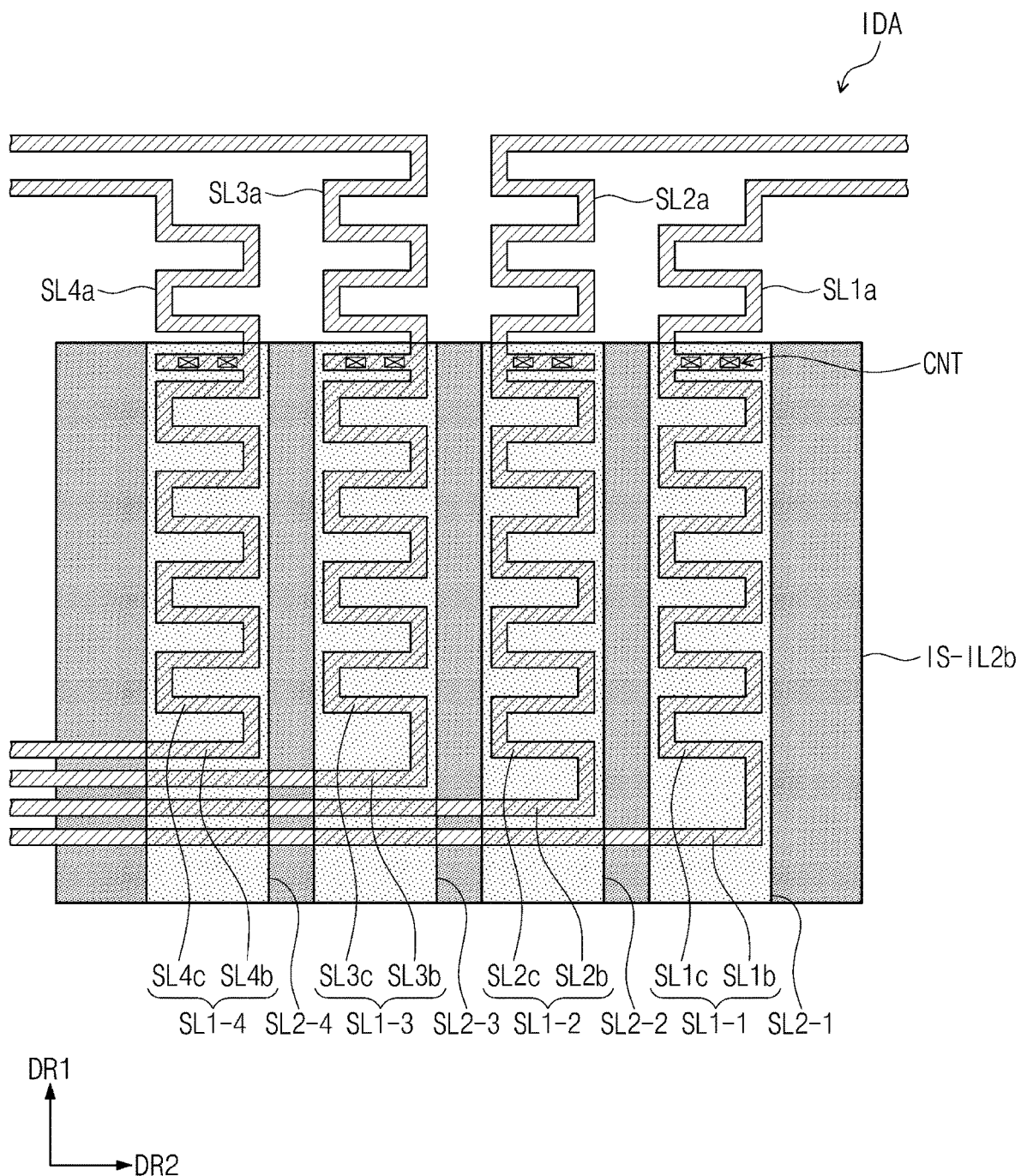
FIG. 14 is an enlarged view of an area IDA of FIG. 5 according to another embodiment of the inventive concept.

FIG. 14 is an enlarged view of an area IDA of FIG. 5 according to another embodiment of the inventive concept.

Referring to FIG. 14, a portion of each of first sub-lines SL1a to SL4a may have the meandering shape. For example, each of the first sub-lines SL1a to SL4a illustrated in FIG. 14 may include at least one pattern PN illustrated in FIG. 10A. As a result, the patterns between the first sub-lines SL1a to SL4a and the connection lines SL1c to SL4c may be substantially similar to each other to improve external visibility.

Also, in this case, the second sensing lines SL2-1 to SL2-4 may have the same planer area, or at least two or more second sensing lines may have different planar areas.

Although certain embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic panel comprising:
    a base layer including a sensing area and a peripheral area adjacent to the sensing area;
    sensing electrodes overlapping the sensing area and disposed on the base layer;
    first lines overlapping the peripheral area and connected to the sensing electrodes;
    an insulation layer comprising a first insulation portion configured to cover the sensing electrodes and disposed on the base layer and a second insulation portion configured to cover at least a portion of each of the first lines and disposed on the base layer; and
    second lines disposed on the second insulation portion and respectively electrically connected to the first lines through contact holes defined in the second insulation portion,
    wherein:
    the first lines comprise:
        first sub-lines, each of which is connected to one end of each of the sensing electrodes;
        second sub-lines connected to other ends of the sensing electrodes, respectively; and
        connection lines respectively connected to the second lines through the contact holes and configured to connect the first sub-lines to the second sub-lines; and
    each of the connection lines has the meandering shape.

2. The electronic panel of claim 1, wherein the at least a portion of each of the first lines comprises:
    a first portion extending in a first direction;
    a second portion extending in the first direction to face the first portion in a second direction different from the first direction; and
    a third portion extending in the second direction to connect the first portion to the second portion.

3. The electronic panel of claim 1, wherein the at least a portion of each of the first lines has a curved shape.

4. The electronic panel of claim 1, wherein the connection lines are entirely covered by the second insulation portion.

5. The electronic panel of claim 1, wherein one second sub line of the second sub-lines crosses two or more second lines of the second lines on a plane.

6. The electronic panel of claim 1, wherein each of the first sub-lines has the meandering shape.

7. The electronic panel of claim 6, wherein the first sub-lines do not overlap the insulation layer.

8. The electronic panel of claim 1, wherein the first sub-lines, the second sub-lines, and the connection lines are disposed on the base layer through the same process.

9. The electronic panel of claim 1, wherein:
    the second lines extend in a first direction and are spaced a predetermined distance from each other in a second direction different from the first direction; and each of the second lines has a planar area per unit length greater than that of each of the first lines.

10. The electronic panel of claim 9, wherein:
each of the second lines comprises a first line portion bonded to an external circuit board and a second line portion that overlaps the at least a portion of each of the first lines; and
the at least the portion of each of the first lines is disposed between the contact holes and the first line portion in the first direction.

11. The electronic panel of claim 10, wherein the contact holes are disposed in the same line in the second direction.

12. The electronic panel of claim 11, wherein the second lines have the same length in the first direction.

13. The electronic panel of claim 10, wherein:
at least two second lines of the second lines have different lengths in the first direction; and
the contact holes overlapping the two second lines among the contact holes are defined in different lines in the second direction.

14. The electronic panel of claim 1, wherein the first insulation portion and the second insulation portion are spaced apart from each other on a plane.

15. The electronic panel of claim 1, wherein each of the first lines comprises a metal, and
each of the second lines comprises an ITO electrode.

* * * * *